United States Patent [19]

Watanabe

[11] Patent Number: 5,029,134
[45] Date of Patent: Jul. 2, 1991

[54] MEMORY CIRCUIT WITH IMPROVED SERIAL ACCESS CIRCUIT ARRANGEMENT

[75] Inventor: Hiroshi Watanabe, Tokyo, Japan

[73] Assignee: NEC Corporation, Japan

[21] Appl. No.: 303,492

[22] Filed: Jan. 27, 1989

[30] Foreign Application Priority Data

Jan. 29, 1988 [JP] Japan .................................. 63-20279

[51] Int. Cl.⁵ .............................................. G11C 7/00
[52] U.S. Cl. ........................... 365/189.05; 365/189.12; 365/240
[58] Field of Search ...................... 365/189.05, 189.12, 365/221, 239, 240

[56] References Cited

U.S. PATENT DOCUMENTS 4,769,789 9/1988 Noguchi et al. ................. 365/219 X Primary Examiner—Joseph A. Popek
Attorney, Agent, or Firm—Laff, Whitesel, Conte & Saret

[57] ABSTRACT

A memory circuit provided with an improved serial access port which can be operated continuously without interruption is disclosed. The memory circuit comprises a plurality of sets of bit lines, each set of bit lines having first and second bit lines, a plurality of sets of latch circuits, eahc set of latch circuits having first and second latch circuits, first means for sequentially deriving data stored in the first latch circuits, second means for sequentially deriving data stored in the second latch circuits, and a plurality of switch circuits, each of the switch circuits being connected between each set of bit lines and each set of latch circuits and selectively providing a signal path between one of the first and second bit lines and one of the first and second latch circuits.

7 Claims, 4 Drawing Sheets

MEMORY CIRCUIT WITH IMPROVED SERIAL ACCESS CIRCUIT ARRANGEMENT

BACKGROUND OF THE INVENTION

1. Field of the Invention

The present invention relates to a semiconductor memory circuit and, more particularly to a semiconductor memory having a serial access circuit.

2. Description of the Related Art

With the progress in memory technology, a semiconductor memory having a serial access function has been developed and put into practical application in place of a conventional random access memory in the field of image processing. Dual port memories, line memories and field memories are typical examples of the above mentioned memory having the serial access function. In the field of image processing which has made a remarkable progress in recent years, for example, the dual port memory is used as a memory (referred to as a "video memory") for holding image data. The dual-port memory of this kind includes a random access port and a serial access port on the single chip. The random access port is the same as the port provided to a conventional RAM (Random Access Memory). Through this port, one bit is read from or written into each arbitrarily accessed memory cell in the case of a 1-bit output type memory, while in the case of a memory for multi-bit parallel output type, the port is used to read or write a plurality of bits at a time. On the other hand, the serial access port usually has a buffer (hereinafter referred to as "line buffer") corresponding to the number of bits of one word, is used to simultaneously receive all the bits in the memory cells connected to the word line selected in accordance with row address information and output them serially to the outside.

In such a dual-port memory used as a video memory, the random access port and the serial access port can be used asynchronously so that the read/write of image data between CPU and the video memory and the read-out of display data from the video memory to a display (such as a CRT or a liquid crystal display) can be made asynchronously. Therefore, the dual-port memory can greatly contribute to the improvement in processing efficiency of CPU, high speed display/simplification of display processing and digitallization of TV, VTR, and the like.

In the above dual port memory, the serial access port includes a word data latch circuit (hereinafter referred to as the "data register") for holding data derived from one selected word, a serial selection circuit for serially selecting data stored in the data register one by one, and a serial port for outputting data designated by the serial selection circuit.

In the above serial access port, data read out on the respective bit lines are transferred to the data register via transfer gates in parallel during a data transfer cycle. During this data transfer cycle, the operation of the serial selection circuit must be interrupted. Therefore, data length which can be read out continuously without interruption is limited to the bit number of the respective word lines. In this connection, it is theoretically possible to avoid the above interruption due to the data transfer cycle by making the data transfer cycle very short and causing the shortened data transfer cycle within the period between the two adjacent serial read operations of the serial selection circuit. However, this method requires to control the operations of the transfer gates and the serial selection circuit with high accuracy. Thus, this method is not practical.

Under the above circumstances, it has been proposed such technique that the data register and transfer gates are splitted into first and second sections, respectively. When bit storages of the first section of data register are sequentially accessed by the serial selection circuit, the second section of the transfer gates are enabled to transfer data on half the bit lines to the second section of the data register. Similarly, when bit storages of the second section of the data register are sequentially accessed by the serial selection circuit, the first section of the transfer gates are enabled to transfer data on the other half the bit lines to the first section of the data register in parallel. Thus, data over a plurality of row addresses i.e., word lines can be read out consecutively without interruption due to the data transfer cycle by alternately controlling the first and second sections of data registers and transfer gates in interleaved manner.

However, according to this method, data on the half of the bit lines and data on the other half of the bit lines must be read out alternately and it is impossible to read data on the half of the bit lines and at a first row address and data on the same half of the bit lines and at a second row address continuously without interruption.

SUMMARY OF THE INVENTION

It is an object to provide a semiconductor memory circuit provided with an improved serial access port having large flexibility in addressing memory location.

It is another object of the present invention to provide a semiconductor memory with an improved serial access port which can operate at a high speed.

A semiconductor memory circuit according to the present invention comprises a plurality of bit line sets each having first and second bit lines, a plurality of word lines intersecting with the bit lines, a plurality of memory cells connected to the word lines and the bit lines, a plurality of latch circuit sets each having first and second latch circuits, a plurality of switch circuits, each of the switch circuits being connected between each set of first and second bit lines and each set of first and second latch circuits and selectively providing a signal path between one of the first and second bit lines of the same set and one of the first and second latch circuits of the same set, control means for controlling the switch circuits in parallel, first means coupled to the first latch circuits for sequentially deriving data stored in the first latch circuits, and second means coupled to the second latch circuits for sequentially deriving data stored in the second latch circuit.

According to the present invention, each of the first and second latch circuits can be used to store data from either one of the first and second bit lines. Thus, while the serial access operation is made on data stored in the first latches circuits from the first or second bit lines, new data or the first or second bit lines can be transferred to the second latch circuits.

Thus, the serial operation can be continuously performed over a plurality of words (rows) without interruption even for the same part of columns.

DETAILED DESCRIPTION OF THE INVENTION

Figure 1:
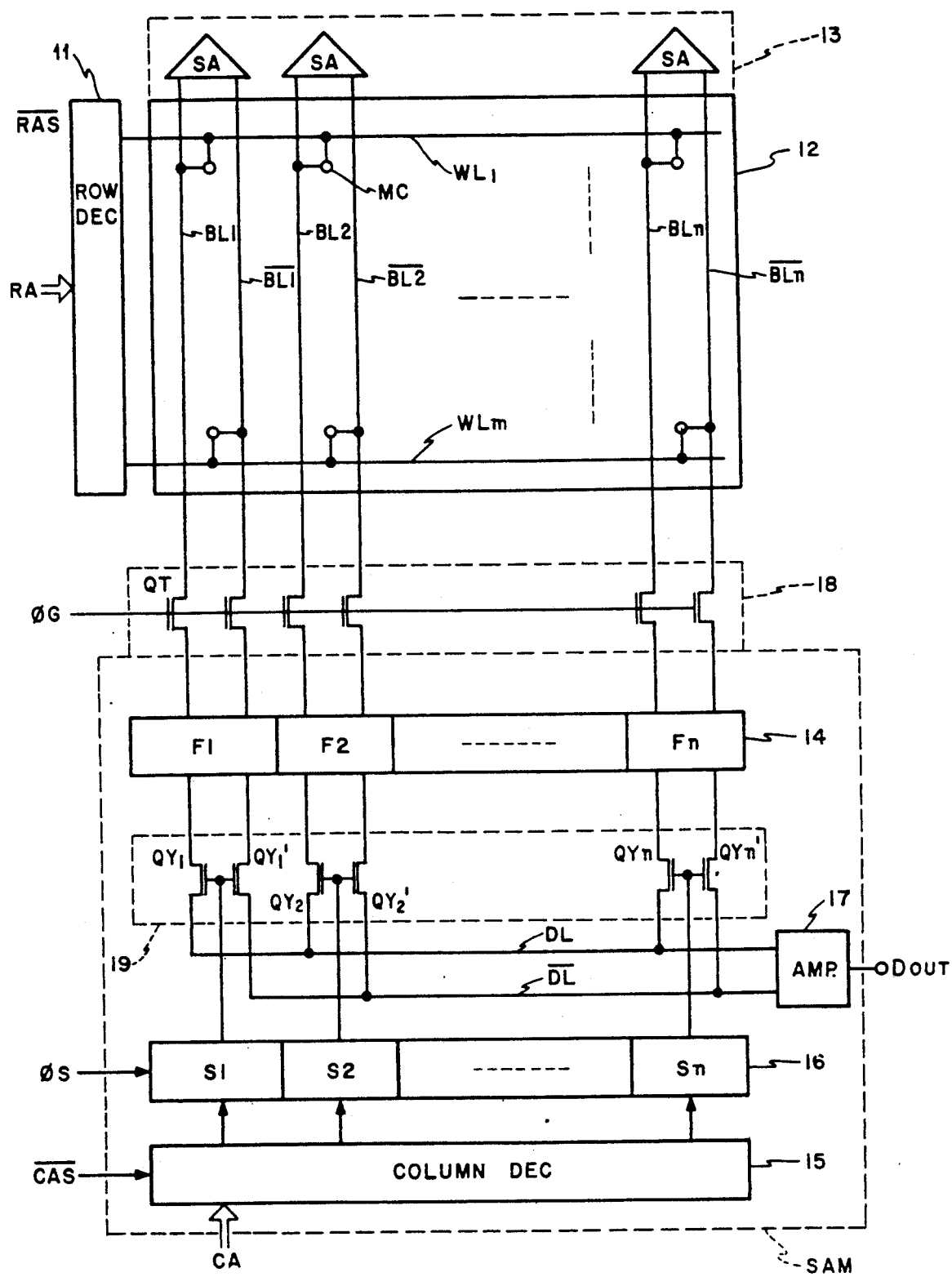
FIG. 1 is a schematic block diagram showing a memory circuit having a serial access port in the prior art.
Figure 2:
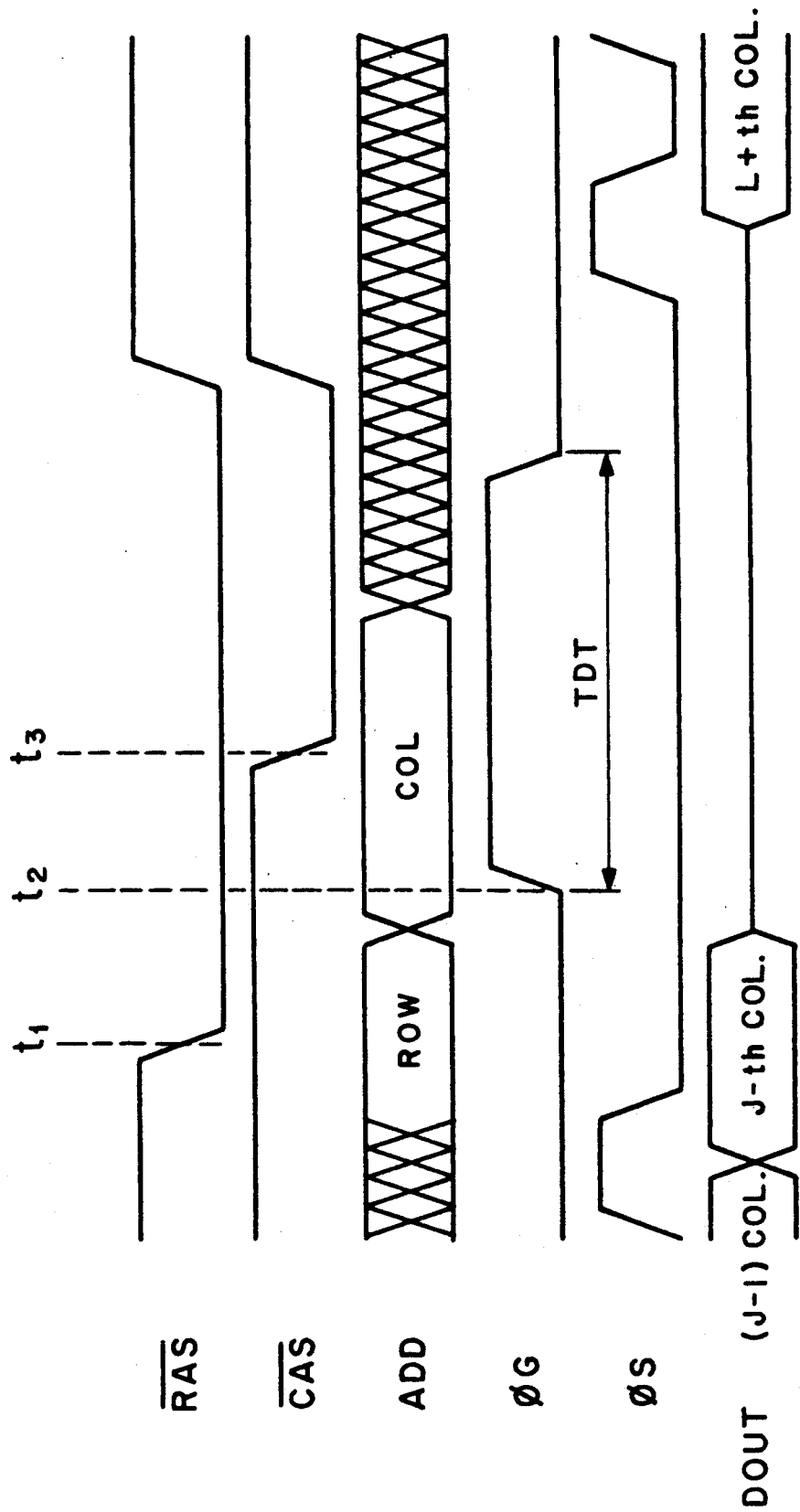
FIG. 2 is a timing diagram showing operations of the memory circuit of FIG. 1.

With reference to FIG. 1, a serial access memory in the prior art will be explained.

As shown in FIG. 1, the serial memory comprises a memory cell array 12, a row decoder 11, a sense amp block 13 including a plurality of sense amplifiers SA, and a serial access port SAM. The structures of the memory cell array 10 having word lines $WL_1$-$WL_m$ in rows, a plurality of pairs of bit lines $BL_1$, $\overline{BL_1}$-$BL_n$, $\overline{BL_n}$ and a plurality of memory cells MC such as one transistor dynamic memory cells and the row decoder 11 are the same as those of the conventional memory.

The serial access port SAM includes a word data holding circuit (hereinafter referred to as the "line buffer") 14 for temporarily holding the data of one word (all the cells connected to one word line) inside the memory cell array 10, a data transfer circuit 18, a serial pointer 16 (usually, a programmable shift register) for arbitrarily sequencing the data bits stored in the line buffer in response to a clock signal $\phi_S$, a column decoder 15 for determining a start point of the serial pointer 16 a serial port 17 for outputting serially the bit designated by the serial pointer 16 to the outside or for writing the data inputted serially from outside into the line buffer, and a serial transfer circuit 19.

The line buffer 14 includes a plurality of latch circuits $F_1$-$F_n$ such as static type flip-flops. The data transfer circuit 18 includes a plurality of serial transfer gate transistors QT connected between the pairs of bit lines $BL_1$, $\overline{BL_1}$-$BL_n$, $\overline{BL_n}$ and input terminals of the latch circuits $F_1$-$F_n$ of the line buffer 14.

The serial transfer circuit 19 includes a plurality of pairs of selection gate transistors $QY_1$, $QY_1'$-$QY_n$, $QY_n'$ connected between outputs of the latch circuits $F_1$-$F_n$ and a pair of data lines DL and $\overline{DL}$, respectively. The gates of the selection gate transistors $QY_1$, $QY_1'$-$QY_n$, $QY_n'$ are connected to outputs of stages $S_1$-$S_n$ of the serial pointer 16 such as a counter, and the pairs of the selection gate transistors are rendered conductive one pair by one pair in sequence in response to the outputs of the serial pointer 16.

The memory may further comprises a conventional random access port and in this case the column decoder 15 may be commonly used for the random access port and the serial access port.

With reference to FIG. 1, operations of the memory of FIG. 1 will be explained.

Before a time point $t_1$, the line buffer 14 stores data read out at the pairs of bit lines which are from the memory cells connected to one word line WLK are sequentially outputted at an output terminal DOUT as shown in . . . (J-2)th Col., (J-1)th Col. in synchronism with a train of shift pulses $\phi_S$. At the time point $t_1$, a row strobe signal $\overline{RAS}$ changes to its active (low) level so that the row address decoder 11 selects another word line WLM in accordance with row address signals RA and the sense amplifiers SA amplify data signals on the respective pair of bit lines. After the amplification of data signals on the bit line, a transfer control signal $\phi_G$ is made high (active) so that the transistors QT of the data transfer circuit 18 are simultaneously rendered conductive. As a result, data on the respective pairs of bit lines are applied to the latch circuits $F_1$-$F_n$ of the line buffer 14, and held thereby. At a time point $t_3$, a column address strobe signal $\overline{CAS}$ becomes an active (low) level so that the column decoder 15 sets the start address in the serial pointer 15 in accordance with column address signals CA. Thereafter, application of the shift pulses $\phi_S$ is re-started and the data stored in the line buffer are read out from the L-th column determinated by the above start address towards the upper (right) direction one bit by one bit.

It the above operation, the serial access operation is interrupted at least during a data transfer cycle $T_{DT}$. Thus, it is not impossible in the memory of FIG. 1 to serially read data stored in two or more word locations without interruption.

Figure 3:
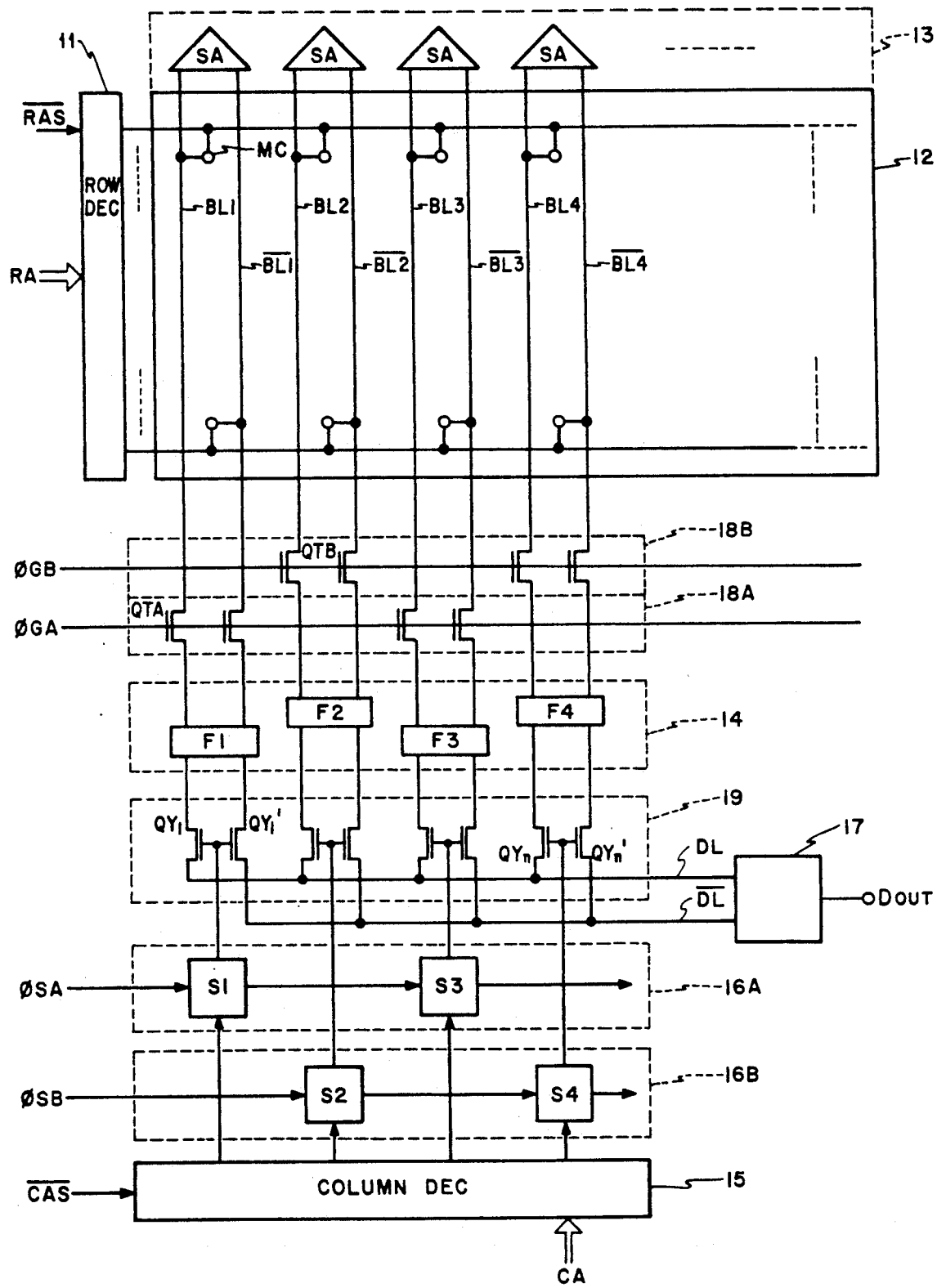
FIG. 3 is a schematic block diagram showing a memory circuit having an improved serial access port in the prior art.

To solve the above problem, a memory circuit of FIG. 3 has been proposed. In the memory of FIG. 3, the columns of the memory array 12 are divided into a two groups i.e. groups A and B, and these two groups of columns are alternately accessed. Namely, the pairs of bit lines are divided into the odd numbers of bit lines $BL_1$, $\overline{BL_1}$, $BL_3$, $\overline{BL_3}$ . . . as the group A and the even numbers of bit lines $BL_2$, $\overline{BL_2}$, $BL_4$, $\overline{BL_4}$ . . . . Similarly, the data transfer circuit 18 of FIG. 1 is divided into an odd data transfer circuit 18A including transfer gate transistors QTA connected between the odd numbers of bit lines and the inputs of the odd stages of latch circuits $F_1$, $F_3$ . . . , and an even data transfer circuit 18B including transfer gate transistors QTB connected between the even numbers of bit lines and the inputs of the even stages of latch circuits $F_2$, $F_4$ . . . . Also, in place of the serial address pointer 16 of FIG. 1, odd and even serial address pointers 16A and 16B. The odd serial pointer 16A has the shift stages $S_1$, $S_3$ . . . whose outputs are used to select the odd numbers of columns sequentially in response to a train of shift pulses $\phi_{SA}$ while the even serial address pointer 16B includes the shift stages $S_2$, $S_4$ . . . whose outputs are used to select the even numbers of columns sequentially in response to a train of shift pulses $\phi_{SB}$. The column decoder 15 has the same function as that of FIG. 1 which is to determine the start address in accordance with column address signals CA. If it is not necessary to optionally determine the start address, the column decoder 15 may be omitted.

In this memory, when data at the odd numbers of columns are sequentially read out by sequentially enabling the odd numbers of selection gate transistors $QY_1$, $QY_1'$; $QY_3$, $QY_3'$ . . . in response to the shift outputs of the odd serial address pointer 16 in synchronism with $\phi_{SA}$, the transfer control signal $\phi_{GB}$ is enabled to apply data at the even numbers of columns ($BL_2$, $\overline{BL_2}$; $BL_4$, $\overline{BL_4}$ . . . ) to the latch circuits of the even number ($F_2$, $F_4$ . . . ) in the line buffer 14 with non-active levels of $\phi_{GA}$ and $\phi_{SB}$. Immediately after all data stored in the odd numbers of data latch circuits $F_1$, $F_3$ . . . are serially read out by the outputs of the odd serial address pointer 16A, generation of the shift pulses $\phi_{SA}$ is stopped while the shift pulses $\phi_{SB}$ are generated so that data stored in the even numbers of data latch circuits $F_2$, $F_4$ . . . are sequentially read out in response to the shift outputs of the even serial address pointer 16B. In this instance, the train of shift pulses $\phi_{SA}$ and the transfer control signal $\phi_{GB}$ are kept at inactive states while the transfer control signal $\phi_{GA}$ is made active so that data generated at the odd columns ($BL_1$, $\overline{BL_1}$; $BL_3$, $\overline{BL_3}$ . . . ) and from a different row address are written into the odd latch circuits $F_1, F_3 \ldots$ via the odd data transfer circuit 18A.

Thus, according to this memory of FIG. 3, data can be serially read out over a plurality of row addresses (word lines) without interruption.

However, the odd columns and the even columns must be accessed alternately and the access order is fixed. Therefore, it is impossible to perform such operation that immediately after serially reading data from the memory cells of a first row and the even or odd columns data from a second row and the same even or odd columns are serially read without interruption. For example, after data stored in the odd latch circuits $F_1, F_3 \ldots$ are serially read out by way of the odd serial address pointer 16, when different data at the odd columns but which are derived from a different row are to be read out, it is necessary that the data transfer signal $\phi_{GA}$ must be made active so that the above different data are applied to the odd latch circuits $F_1, F_3 \ldots$ in parallel. Only after the transfer of the different data to the odd latch circuits, the different data stored in the odd latch circuits are sequentially read out. Thus, it is inevitably necessary to provide the data transfer cycle in the above operation.

Figure 4:
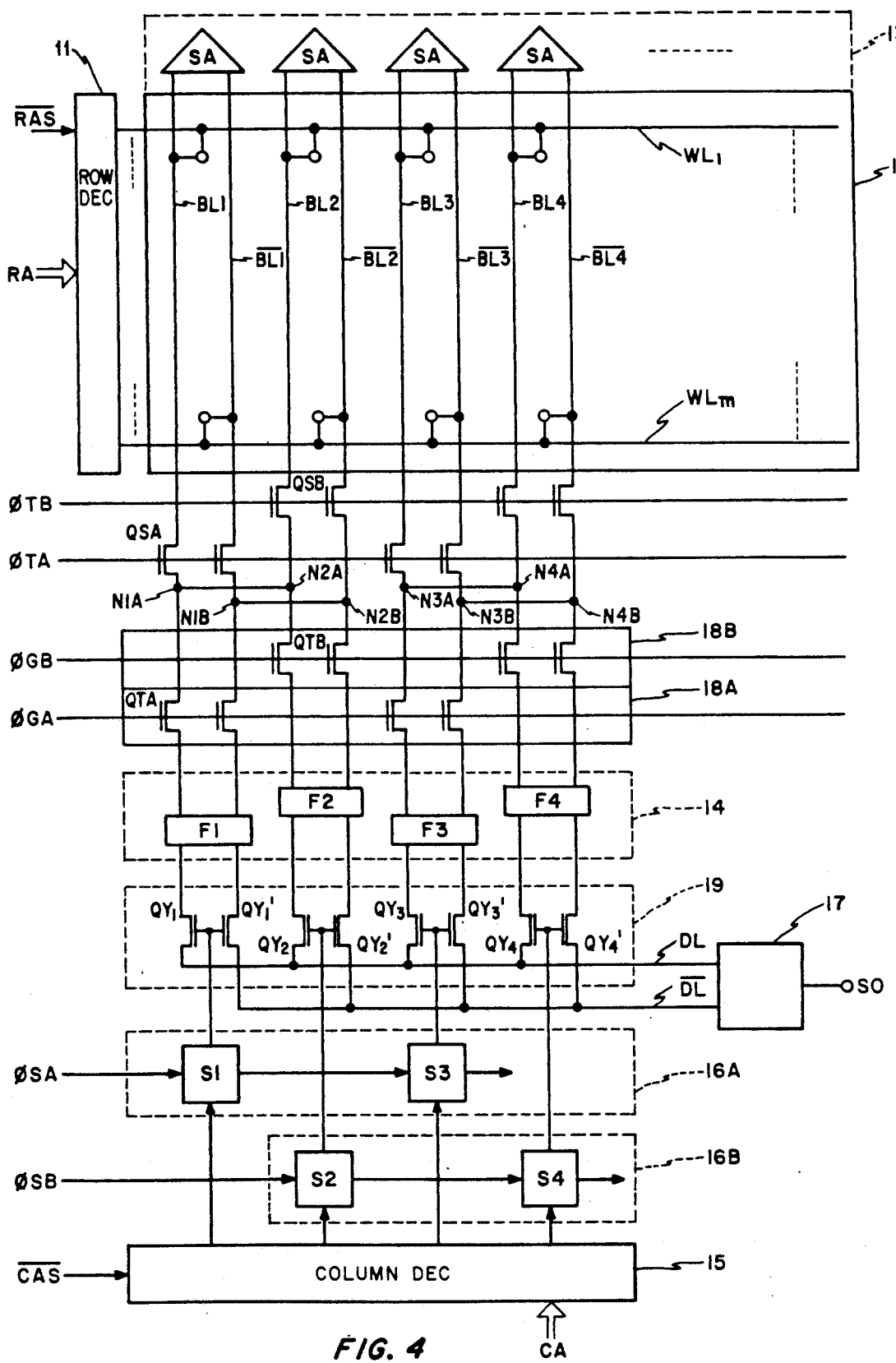
FIG. 4 is a schematic block diagram showing a memory circuit having a serial access port according to one embodiment of the present invention.

With reference to FIG. 4, a serial memory circuit according to one embodiment of the present invention will be explained.

In FIG. 4, the elements or the portions corresponding to those in FIGS. 1 and 3 are denoted by the same or similar references.

The memory of the present embodiment is attained by inserting transfer gate transistors QSA and QSB between the odd column bit lines and even column bit lines and input ends N1A, N1B; N2A, N2B ... of the data transfer circuits 18A and 18B, respectively, and connecting the input ends (e.g. N1A, N1B and N2A, N2B) of the adjacent even and odd columns in parallel.

The transfer gates QSA of the odd columns are controlled by a switch signal $\phi_{TA}$ while the transfer gates QSB of the even columns are controlled by a switch signal $\phi_{TB}$.

For the every two adjacent odd and even columns, the pair of transfer gate QSA and the pairs of transfer gates QSB perform an exchange switch together with the pairs of transfer gates QTA and QTB. For example, the pair of lines $BL_1, \overline{BL_1}$ are connected to the inputs of the latch circuit $F_2$ via the pair of transfer gates QSA and the pair of transfer gates QTB when the both pairs of transfer gates QSA and QTB are made conductive simultaneously, and connected to the inputs of the latch circuit $F_1$ via the pairs of transfer gates QSA and QTA when both pairs of transfer gates QSA and QTA are made conductive. Similarly, the pair of bit lines $BL_2$ and $\overline{BL_2}$ are connected to the input terminals of the latch circuit $F_1$ via the pairs of transfer gates QSB and QTA and to the input terminals of the latch circuit $F_2$ via the pairs of transfer gatess QSB and QTB. Thus, each pair of bit lines e.g. $BL_1, \overline{BL_1}$ can utilize both of the latch circuits $F_1$ and $F_2$.

Next, the operation of the memory of FIG. 4 will be explained.

When the serial access operation is made on data stored the odd latch circuits $F_1, F_3 \ldots$ which have been derived from the odd bit lines by usage of the shift output of the odd serial address pointer 16 in synchronism with the train of shift pulses $\phi_{SA}$, one word line is selected to generate new data at the respective pairs of bit lines and the new data at the odd columns of bit lines are latched by the even latch circuits $F_2, F_4 \ldots$ via the transfer gates QSA and QTB which are made conductive in response to the active level of $\phi_{TA}$ and $\phi_{GB}$. After the serial access operation is made on data stored the odd latch circuits $F_1, F_3 \ldots$, the serial access operation is made on the new data stored in the even latch circuit $F_2, F_4 \ldots$ by usage of the shift output of the even serial address pointer 16B. The similar serial operation is also possible on data at the odd columns of bit lines.

Thus, according to the present invention, it is possible to perform the serial access operation for a plurality row address and the same even or odd columns, without interruption of the cycle.

In accordance with the present invention described above, since the two-stage transfer gates are disposed between the bit line pairs and the latch circuits, the arbitrary data of the two sets (odd, even) of bit line pairs can be transferred to the two sets of latch circuits and the data of the arbitrary address can be transferred to the other register while the data of the arbitrary address is being outputted serially. Moreover, the limit imposed on the data transfer cycle can be mitigated without increasing the number of register groups to the greater number than the number of bit line pairs.

I claim:

1. A semiconductor memory circuit comprising a plurality of bit line sets, a plurality of word lines intersecting with said bit lines, each of said but line sets having first and second bit lines, a plurality of memory cells connected to said word lines and said bit lines, a plurality of latch circuit sets each having first and second latch circuits, a plurality of switch circuits, each of said switch circuits being connected between each set of first and second bit lines and each set of first and second latch circuits and selectively providing a signal path between one of the first and second bit lines of the same set for one of said first and second latch circuits of the same set, each of said switch circuits includes a first transfer gate connected between the first bit line of the associated bit line set and a common node, a second transfer gate connected between said common node and the first latch circuit of the associated latch circuit set, a third transfer gate connected between the second bit line of the associated bit line set and said common node, and a fourth transfer gate connected between said common node and the second latch circuit of the same latch circuit set, control means for controlling said switch circuits simultaneously, first means coupled to said first latch circuits for sequentially deriving data stored in said first latch circuits, and second means coupled to said second latch circuits for sequentially deriving data stored in said second latch circuits.

2. The semiconductor memory circuit according to claim 1, further comprising a row decoder for selecting one of said word lines.

3. The semiconductor memory circuit according to claim 1, further comprising third means for determining a start address location of one of said first and second means.

4. The semiconductor memory circuit according to claim 1, further comprising means for making one and the other of said first and third transfer gates in each said switch circuit conductive and non-conductive respectively, and means for making one and the other of said second and fourth transfer gates in each said switch circuit conductive and non-conductive, respectively.

5. The semiconductor memory according to claim 1, further comprising a common data line, a plurality of first selection gates connected between said first latch circuits and said common data line and a plurality of second selection gates connected between said second latch circuits and said common data line.

6. A semiconductor memory circuit comprising a plurality of bit line sets each having first and second bit lines, a plurality of word lines intersecting with said bit lines, a plurality of memory cells connected to said word lines and said bit lines, a plurality of latch circuit sets each having first and second latch circuits, a plurality of switch circuits, each of said switch circuits being connected between each set of first and second bit lines and each set of first and second latch circuits and selectively providing one of first to fourth signal paths, said first signal path being connected between the first bit line of the associated bit line set and the first latch circuit of the associated latch circuit set, said second signal path being connected between the second bit line of the associated bit line set and the first latch circuit of the associated latch circuit set, said third signal path being connected between the first bit line of the associated bit line set and the second latch circuit of the associated latch circuit set, said fourth signal path being connected between the second bit line of the associated bit line set and the second latch circuit of the associated latch circuit set, control means for controlling said switch circuit simultaneously, first means coupled to said first latch circuits for sequentially deriving data stored in said first latch circuits, and second means coupled to said second latch circuits for sequentially deriving data stored in said second latch circuits.

7. The semiconductor memory circuit according to claim 6, in which each of said switch circuits includes a first transfer gate connected between the first bit line of the associated bit line set and a common node, a second transfer gate connected between said common node and the first latch circuit of the associated latch circuit set, a third transfer gate connected between the second bit line of the associated bit line set and said common node, and a fourth transfer gate connected between said common node and the second latch circuit of the same latch circuit set.

* * * * *